(12) United States Patent
Tsao et al.

(10) Patent No.: US 10,064,315 B2
(45) Date of Patent: Aug. 28, 2018

(54) HIGH HEAT-DISSIPATION CIRCUIT BOARD ASSEMBLY SYSTEM AND POWER SUPPLY INCLUDING THE SAME

(71) Applicants: LITE-ON ELECTRONICS (GUANGZHOU) LIMITED, Guangzhou (CN); LITE-ON TECHNOLOGY CORP., Taipei (TW)

(72) Inventors: Chien-Hsiung Tsao, New Taipei (TW); Yan-Ning Chen, Yilan County (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 15/297,458

(22) Filed: Oct. 19, 2016

(65) Prior Publication Data
US 2017/0303427 A1 Oct. 19, 2017

(30) Foreign Application Priority Data
Apr. 14, 2016 (CN) .......................... 2016 1 0236780

(51) Int. Cl.
| H05K 7/20 | (2006.01) |
| H05K 1/02 | (2006.01) |
| H05K 1/18 | (2006.01) |

(52) U.S. Cl.
CPC ............ *H05K 7/209* (2013.01); *H05K 1/0203* (2013.01); *H05K 1/181* (2013.01); *H05K 2201/1003* (2013.01); *H05K 2201/10015* (2013.01); *H05K 2201/10166* (2013.01); *H05K 2201/10227* (2013.01)

(58) Field of Classification Search
None
See application file for complete search history.

(56) References Cited

U.S. PATENT DOCUMENTS

| 8,836,459 B1 * | 9/2014 | Hsu ....................... H01F 27/022 336/192 |
| 2004/0032313 A1 * | 2/2004 | Ferencz ................ H01F 27/266 336/200 |
| 2010/0328893 A1 * | 12/2010 | Higashidani ....... H05K 7/20927 361/702 |
| 2011/0310558 A1 * | 12/2011 | Teng .................... H05K 7/1492 361/695 |

\* cited by examiner

*Primary Examiner* — Dimary Lopez Cruz
*Assistant Examiner* — Zhengfu Feng
(74) *Attorney, Agent, or Firm* — Rosenberg, Klein & Lee (57) ABSTRACT

The disclosure provides a power supply including a high heat-dissipation circuit board assembly system in which a rack is installed on a circuit board so as to be connected to a transformer. Heat produced when electronic components installed on the circuit board are actuated may be conducted and dissipated thereby. The efficiency and the heat conductivity effect of the power supply may be further enhanced by distributing the amount and the flowing direction of the current from the transformer.

18 Claims, 9 Drawing Sheets

HIGH HEAT-DISSIPATION CIRCUIT BOARD ASSEMBLY SYSTEM AND POWER SUPPLY INCLUDING THE SAME

CROSS-REFERENCE TO RELATED APPLICATION

This application claims priority of Chinese Patent Application No. 201610236780.9, filed on Apr. 14, 2016.

FIELD

The disclosure relates to a high heat-dissipation circuit board assembly system and a power supply including the same.

BACKGROUND

Since a conventional low-voltage high-current power supply is used in view of having the high current, it is required for the power supply to be provided with a circuit board having a copper-clad surface with a copper-clad area which has a corresponding size for sustaining heat produced after the high current flows therethrough and for decreasing circuit transmission loss. Accordingly, in designing the power supply, it is required to provide a large copper-clad area to be used as a space for dissipating the heat produced when the high current flows therethrough. In addition, since a tin-plated copper foil usually has a thickness of 0.0684 mm (2 oz), it is not sufficient to provide a lateral area enough for the high current to flow therethrough, which may thus lead to accumulation of heat and reduction of voltage output efficiency caused by gradually raising temperature due to increasing impedance. Furthermore, since the circuit board is provided with electronic components (e.g., transistors) on a back surface thereof and the electronic components will produce heat during operation thereof, it is also required to dissipate heat produced by the electronic components during the operation so as to prevent the operation of the electronic components from being affected by excessively high temperature.

SUMMARY

Therefore, an object of the disclosure is to provide a power supply including a high heat-dissipation circuit board assembly system.

Another object of the disclosure is to provide a high heat-dissipation circuit board assembly system.

According to a first aspect of the disclosure, there is provided a power supply which comprises a high heat-dissipation circuit board assembly system including a circuit board, a transformer, a plurality of electronic components, and at least one rack.

The circuit board includes a substrate having a first surface and a second surface opposite to each other, an electric circuit formed on the substrate, and at least one inserting hole penetrating through the substrate.

The transformer is installed on the first surface of the substrate and is electrically connected to the electric circuit.

The electronic components are installed on the substrate and are electrically connected to the electric circuit.

The at least one rack is fastened on the first surface of the substrate and includes a first support portion and a second support portion extending from the first support portion. The first support portion is installed corresponding to the inserting hole and is connected to the transformer. The second support portion extends from the first support portion toward the electronic components and is installed upright on the substrate.

According to a second aspect of the disclosure, there is provided a high heat-dissipation circuit board assembly system which comprises the circuit board, the transformer, a plurality of the electronic components, and the at least one rack, as described above.

In the disclosure, the rack may be connected to the transformer using a structural design of the rack. Therefore, heat produced by the transformer and the electronic components may be more effectively conducted and dissipated. In addition, the heat conductivity effect of the power supply may be further enhanced by distributing the amount and the flowing direction of the current from the transformer.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
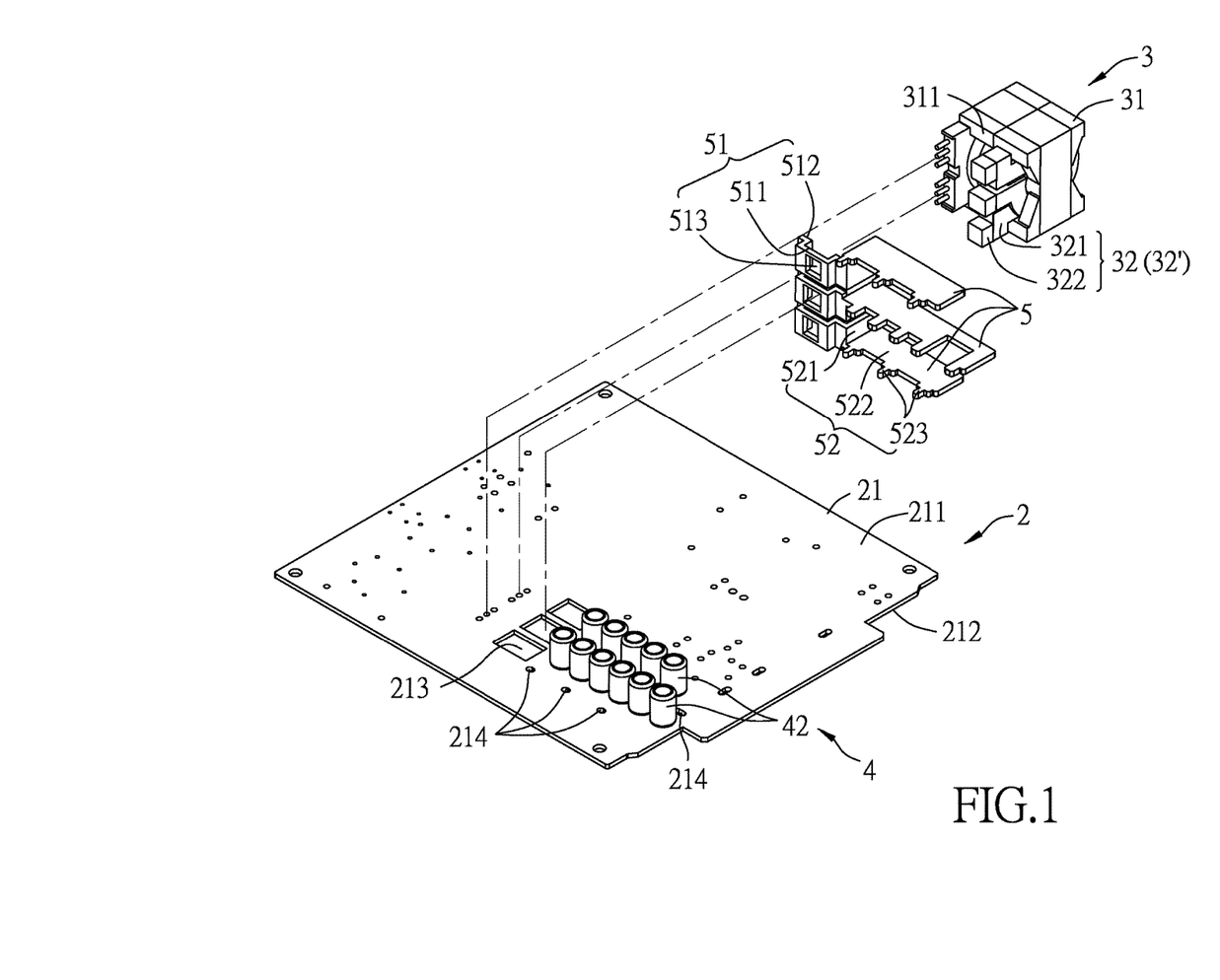
FIG. 1 is an exploded perspective view of an embodiment of the disclosure.
Figure 2:
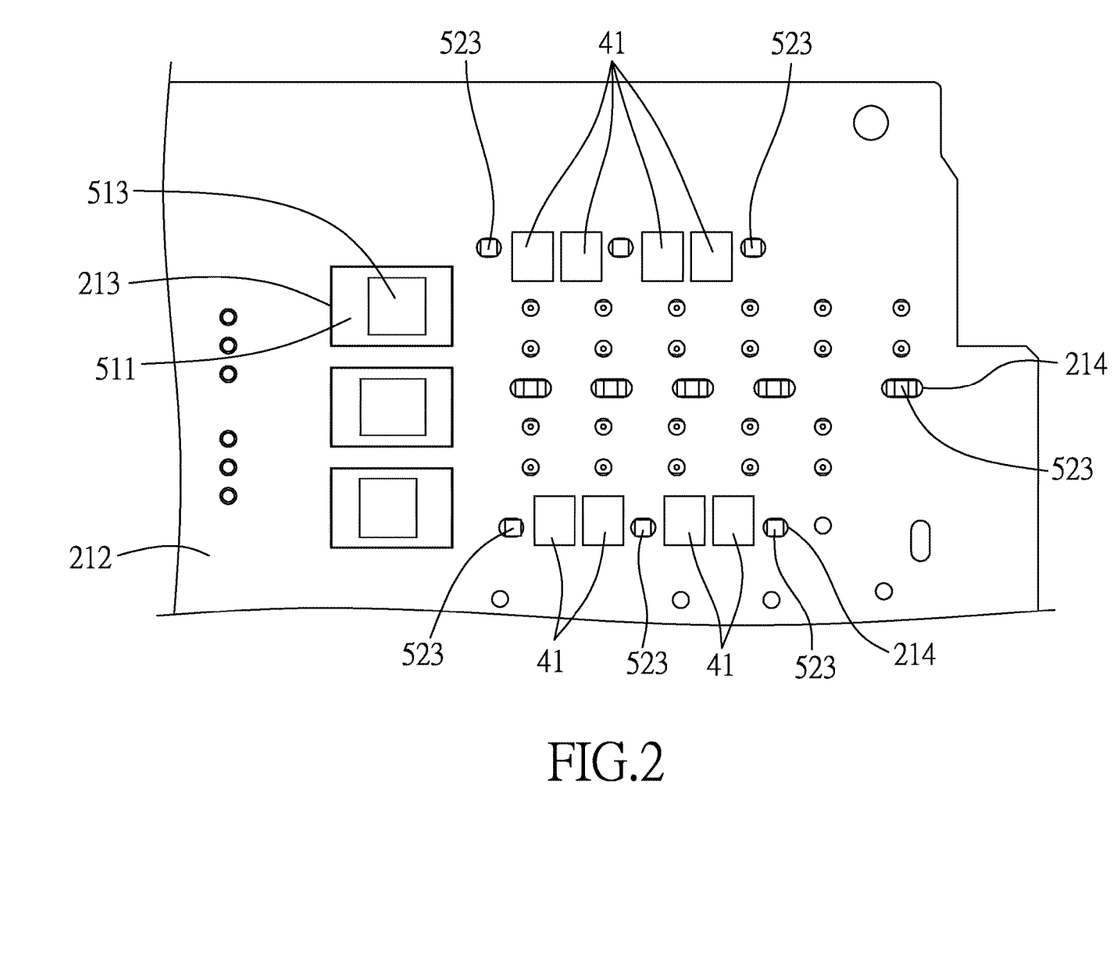
FIG. 2 is a fragmentary schematic bottom view of the embodiment.
Figure 3:
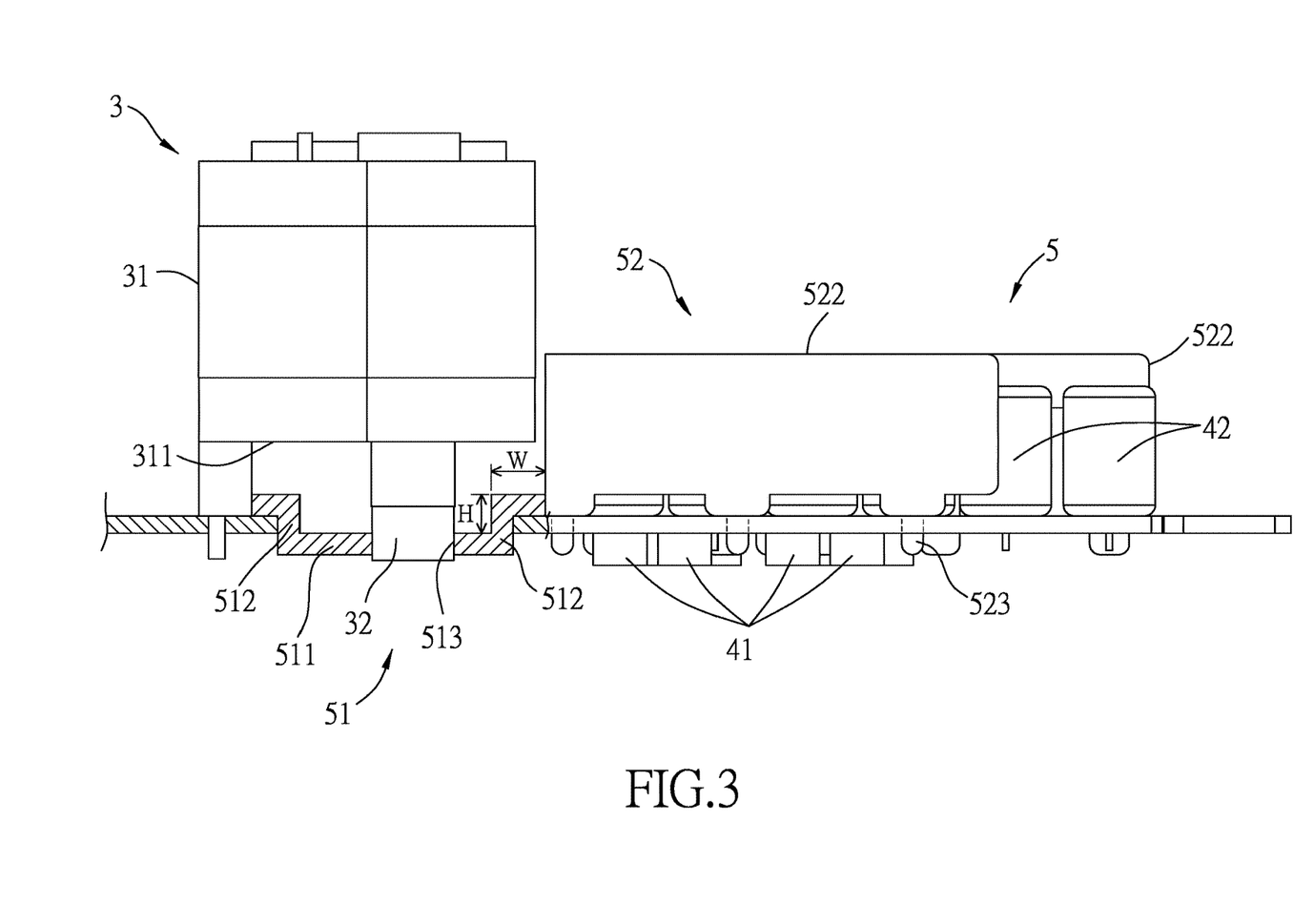
FIG. 3 is a schematic side view of the embodiment.
Figure 4:
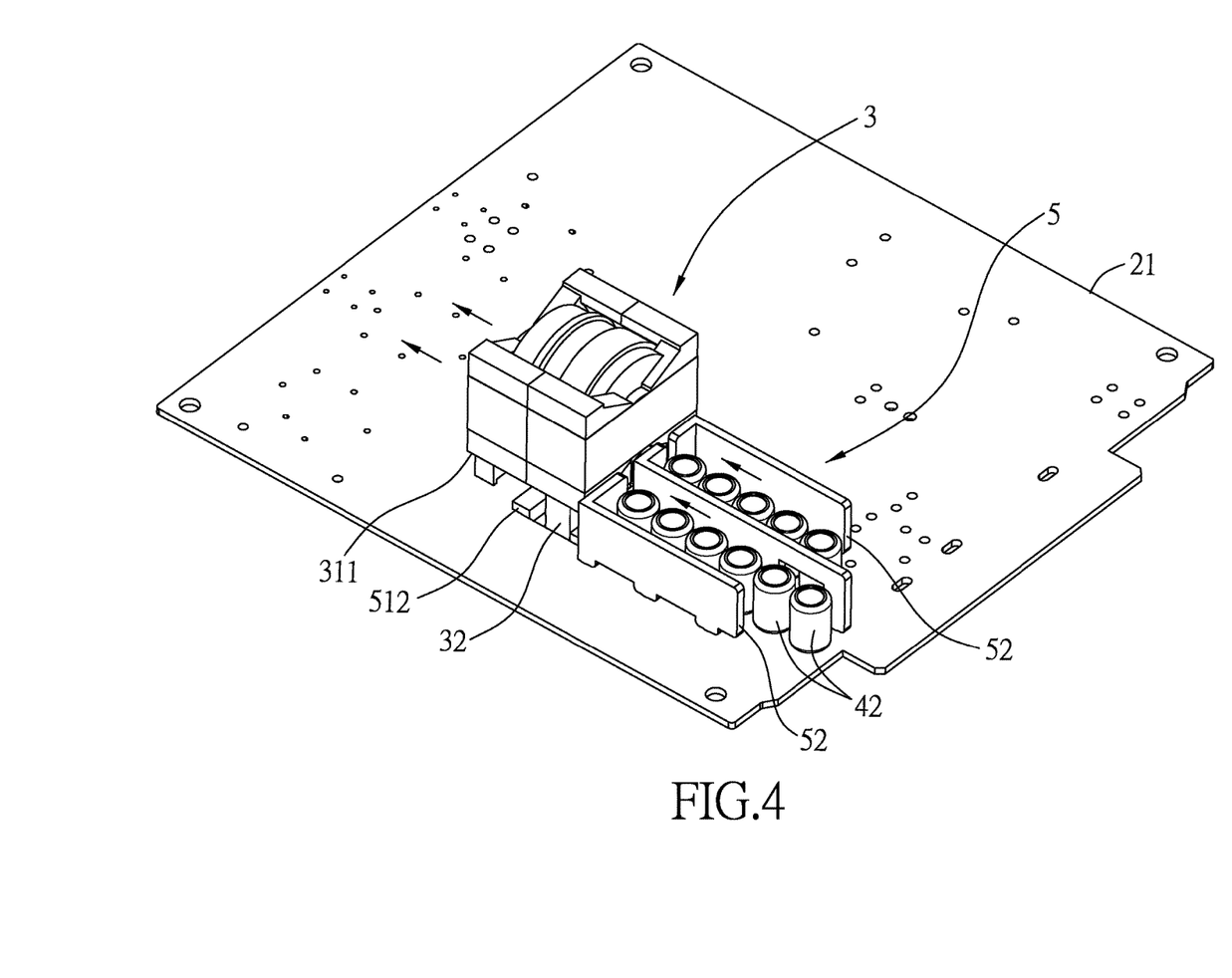
FIG. 4 is a schematic perspective assembly view of the embodiment.

Referring to FIGS. 1 to 4, an embodiment of a high heat-dissipation circuit board assembly system according to the disclosure is included in a power supply and comprises a circuit board 2, a transformer 3, a plurality of electronic components 4, and a plurality of racks 5. FIG. 1 is an exploded perspective view of the embodiment. FIG. 2 is a fragmentary schematic bottom view of the embodiment. FIG. 3 is a schematic side view of the embodiment. FIG. 4 is a perspective assembly view of the embodiment.

The circuit board 2 includes a substrate 21 and an electric circuit (now shown). The substrate 21 may be a copper-clad substrate, a metal core printed circuit board (MCPCB), a ceramic substrate, or the like, and has a first surface 211, a second surface 212 opposite to the first surface 211, three inserting holes 213 penetrating through the substrate 21 from the first surface 211 to the second surface 212, and a plurality of pin holes 214. The electric circuit is formed in advance on the substrate 21 via a semiconductor process and is used for subsequent electric connection to the electronic components 4.

The transformer 3 is installed on the first surface 211 of the substrate 21, and is electrically connected to the electric circuit. Specifically, the transformer includes a main body 31 and at least one height-adjusting member 32 which is disposed on a bottom portion 311 of the main body 31 and which is made from an electrically conductive material. The transformer 3 is formed with at least one gap between the main body 31 and the substrate 21 and at least one gap between the main body 31 and the racks 5 using the at least one height-adjusting member 32. In the embodiment, the at least one height-adjusting member 32 is illustrated by three leads 32', each of which extends from the main body 31 of the transformer 3 and corresponds to one of the racks 5. Specifically, each of the leads 32' includes a first extending segment 321 extending away from the bottom portion 311 of the main body 31, and a second extending segment 322 extending from the first segment 321. The first extending segment 321 has a width larger than that of the second extending segment 322.

The inserting holes 213 and the transformer 3 are positioned oppositely. When the transformer 3 is installed on the first surface 211 of the substrate 21, the inserting holes 213 are located be low the trans former 3 as viewing from the side of the first surface 211, and the inserting holes 213 are located above the transformer 3 as viewing from the side of the second surface 212. In addition, it should be understood that the transformer 3 is not limited to be installed on the first surface 211 and may be installed on the second surface 212 according to specific design and/or requirement.

The electronic components 4 are installed on the substrate 21. In some embodiments, the electronic components 4 and the transformer 3 are installed at the same side of the substrate 21. It should be understood that there is no specific limit to the types of the electronic components 4 and that the arrangement of the electronic components 4 is not limited to a linear arrangement. The electronic components 4 may be arranged in a curve shape or other shapes as long as the racks 5 may be installed among or proximate to the electronic components 4. The electronic components 4 illustrated in the embodiment include a plurality of transistors 41 installed on the second surface 212 and electrically connected to the electric circuit, and a plurality of capacitors 42 installed on the first surface 211 and electrically connected to the transistors 41. The transistors 41 are arranged substantially in two rows, and the capacitors 42 are arranged in two rows between the two rows of the transistors 41. However, the arrangement of the electronic components 4 is not limited thereto in practical implementation.

The racks 5 are made from an electrically conductive material. In some embodiments, the racks 5 are made from a metal material having high electric and thermal conductivities, such as copper, aluminum, or the like. In the embodiment, since the transistors 41 are arranged in two rows, three racks 5 are illustrated, in which two of the three racks 5 are installed corresponding to the two rows of the transistors 41, and the rest one of the three racks 5 is installed between the two rows of the capacitors 42. However, in practical implementation, one, two, or more of the racks 5 may be installed at an area proximate to the electronic components 4.

Specifically, each of the racks 5 is installed on the first surface 211 of the substrate 21, and includes a first support portion 51 and a second support portion 52.

The first support portion 51 includes a base frame 511 and two extending segments 512. The base frame 511 has at least one inserting portion 513 to permit a corresponding one of the leads 32' to insert and fasten therein. The two extending segments 512 respectively extend a height (H) upward from two opposite sides of the base frame 511 which are respectively distal from and proximate to the electronic components 4, and then extend a width (W) oppositely. The base frame 511 penetrates through a corresponding one of the inserting holes 213 and protrudes from the second surface 212 of the substrate 21. It is illustrated in the embodiment that the base frame 511 is provided with the inserting portion 513 which is configured as an opening. Each of the leads 32' penetrates through the inserting portion 513 of a corresponding one of the racks 5 and is disposed in a corresponding one of the inserting holes 213. It should be understood that the first and second extending segments 321, 322 of each of the leads 32' may be adjusted so that each of the leads 32' may penetrates through a corresponding one of the inserting holes 213 and protrudes from the second surface 212 of the substrate 21 or inserts within the corresponding one of the inserting holes 213 and does not protrude from the second surface 212 of the substrate 21. It is illustrated in FIG. 1 that each of the leads 32' penetrates through the corresponding one of the inserting holes 213 and protrudes from the second surface 212 of the substrate 21.

In addition, it should be understood that as illustrated in view of arrangement of the electronic components 4, one or more of the racks 5 may be installed when the transistors 41 are arranged in a row, and a plurality of the racks 5 may be installed when the transistors 41 are arranged in a plurality of rows. The number of the inserting holes 213 of the substrate 21 may be adjusted according to the number of the racks 5 as so to correspond to the number of the racks 5. Since the numbers of the racks 5 and the inserting holes 213 may be adjusted in view of practical design, further interpretation thereof is not described herein. In the embodiment, it is illustrated by two rows of the transistors 41, three of the racks 5 in linear configurations, and three of the inserting holes 213 corresponding to the racks 5. However, in practical implementation, the configuration of each of the racks 5 is not limited to the illustration in the embodiment, and may have a non-linear type according to considerations such as installation positions and design requirements of the transformer 3 and an output of the power supply. For example, each of the racks 5 may alternatively be L-shaped, S-shaped, or fishbone-shaped. For example, when the rack 5 has a fishbone-shaped configuration, a backbone of the rack 5 is positioned between two rows of the capacitors 42 and each of braches of the rack 5 is positioned between two proximate ones of the capacitors 42.

The size of the gap between the transformer 3 and the substrate 21 and the size of the gap between the transformer 3 and the racks 5 may be controlled via cooperation of a width difference between the first extending segment 321 and the second extending segment 322 of each of the leads 32' with the opening size of the inserting portion 513 of the base frame 511. As an example of the leads 32' each of which includes the first extending segment 321 having a width of 2 cm and the second extending segment 322 having a width of 1 cm, when the inserting portion 513 has an opening width of 1 cm, only the second extending segment 322 may penetrate through the inserting portion 513, and when the inserting portion 513 has an opening width of 2 cm, both the first and second extending segments 321, 322 may penetrate through the inserting portion 513 and the size of the gap between the transformer 3 and the substrate 21 may be decreased. In the embodiment illustrated in FIG. 1, the leads 32' each of which includes two different extending segments having different widths are used for height adjustment without consideration of an electrical insulation issue. However, the leads 32' each of which has more different extending segments having more different widths may be used. In addition, there is no limit to the geometry of the leads 32', and the manner for adjusting the height of the transformer 3 is not limited to that illustrated in the embodiment. For example, the lead 32' may be adjusted and fastened using a fixture. Alternatively, the other components of the transformer 3 may be used as the height-adjusting member 32 as long as the height of the transformer 3 may be adjusted thereby so as to permit the gap to be formed between the transformer 3 and the substrate 21 and between the transformer 3 and the racks 5.

The second support portion 52 includes a first support wall 521, a second support wall 522, and a plurality of pins 523. The first support wall 521 is connected to the one of the two extending segments 512 of the first support portion 51 proximate to the electronic components 4 and has a predetermined height. The second support wall 522 extends from a side of the first support wall 521, is positioned at one side of a corresponding row of the capacitors 42, and is installed upright and substantially vertically on the first surface 211 of the substrate 21. The pins 523 extend from a bottom portion of the second support wall 522, penetrate through the pin holes 214, and are fastened to the substrate 21 via soldering. The pins 523 are electrically connected to at least some of the electronic components 4 via the electric circuit. A gap may be formed between the second support wall 522 and the substrate 21 via the pins 523. Alternatively, the second support wall 522 may be installed directly on the first surface 211 of the substrate 21 without the gap. In addition, the transistors 41 arranged corresponding to the second support portions 52 are distributed substantially among the pins 523 of the second support walls 522. Therefore, heat produced by the transistors 41 may be more easily directed toward the second support walls 522 via the pins 523 and are then dissipated. It is illustrated in the embodiment that two of the transistors 41 are installed between two proximate ones of the pins 523. However, the installation of the transistors 41 is not limited thereto.

In the embodiment of the high heat-dissipation circuit board assembly system of the disclosure, each of the height-adjusting members 32 (i.e., leads 32' in the embodiment) of the transformer 3 is connected to the first support portion 51 of a corresponding one of the rack 5, and at least one gap is formed between the transformer 3 and the first support portion 51 and between the transformer 3 and the substrate 21 via the leads 32'. The gap defined between the bottom portion 311 of the transformer 3 and the base frame 511 of the first support portion 51 and the gap defined between the bottom portion 311 of the transformer 3 and the extending segments 512 are formed in view of consideration of electrical insulation. Since the leads 32' which are electrically conductive are respectively electrically connected to the racks 5 which are electrically conductive, the current from the transformer 3 may thus be divided and flow to each of the racks 5. That is, the current from the transformer 3 may be distributed to the racks 5 via the leads 32'. For example, when a current of 100 A is provided from the transformer 3, a current of 50 A may be distributed by middle one of the lead 32' to a corresponding one of the racks 5, and a current of 25 A may be distributed by each of the other two of the lead 32' to a corresponding one of the racks 5. The current from the transformer 3 may be guided and distributed by the racks 5 of which the configuration and arrangement may be design according to specific requirement in the disclosure. However, in a conventional circuit board, additional lead wires are required to distribute the current from the transformer 3 due to insufficient copper-clad area on the conventional circuit board. In addition, since the racks 5 are made from a metal material having high electric and thermal conductivities and have large lateral areas, the f low path of the current may be altered to increase the cross section of the electrically conductive channel so that some of the current from the transformer 3 may be guided via the racks 5 to the electronic components 4 and the current flowing from the leads 32' of the transformer 3 via the electric circuit of the substrate 21 from the beginning may be reduced and that the effect for heat dissipation may be enhanced.

Furthermore, since the base frame 511 of the first support portion 51 of each of the racks 5 penetrates through the substrate 21 and protrudes from the second surface 212 of the substrate 21, the heat produced by the transformer 3 may be conducted via the first support portion 51 of each of the racks 5 and be dissipated outside. In addition, the heat produced from the actuation of the transistors 41 installed on the second surface 212 of the substrate 21 may be conducted via the first support portion 51 of each of the racks 5 to the first surface 211 of the substrate 21 and be dissipated. Therefore, the disadvantage of heat accumulation at the second surface 212 encountered in the prior art may be avoided. Moreover, since the ventilation and the wind flow above the substrate 21, which are shown by arrows in FIG. 4, may be enhanced by the gap formed via the leads 32', the effect for heat dissipation and the efficiency of the power supply may be further enhanced. Therefore, the size and the thickness of the racks 5 may be further reduced so as to miniaturize the power supplier and to reduce the cost for the power supply.

The racks 5 illustrated in the embodiment are made from a metal material having high electric and thermal conductivities, and the high heat-dissipation circuit board assembly system may thus have performances of current distribution and high heat dissipation. In practical implementation, the racks 5 may be formed from a heat-dissipation material which is not electrically conductive, and the high heat-dissipation circuit board assembly system may still have the performance of high heat dissipation thereby.

Figure 5:
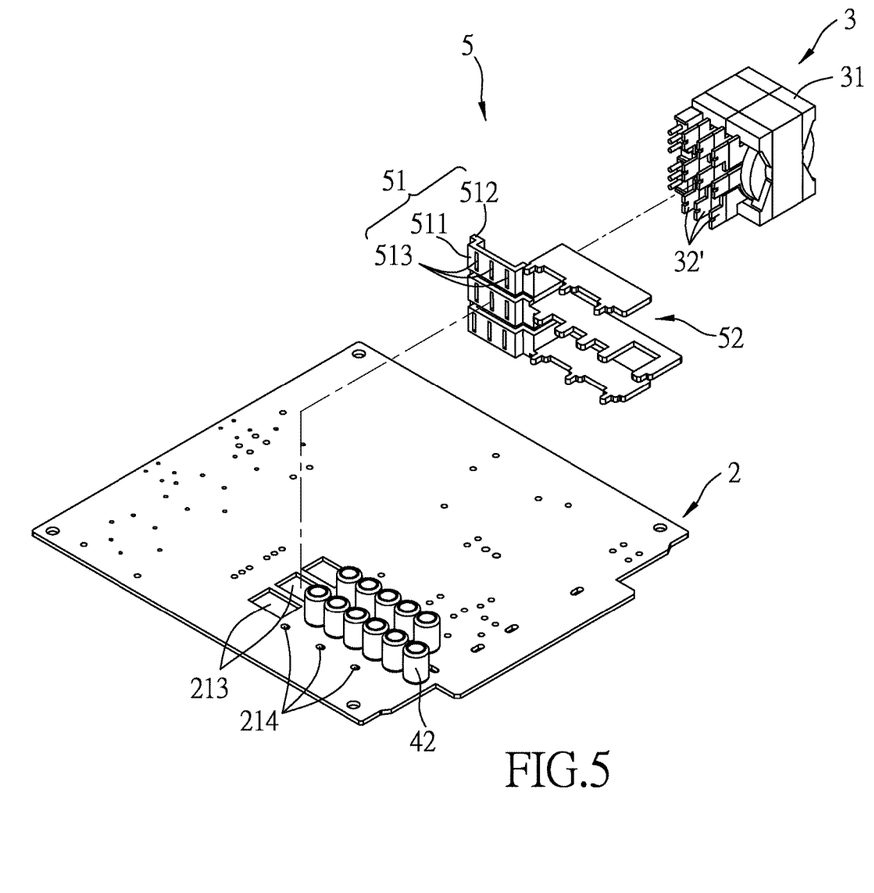
FIG. 5 is a schematic perspective view of the embodiment to illustrate a variant of a base frame of a rack provided in the embodiment.
Figure 6:
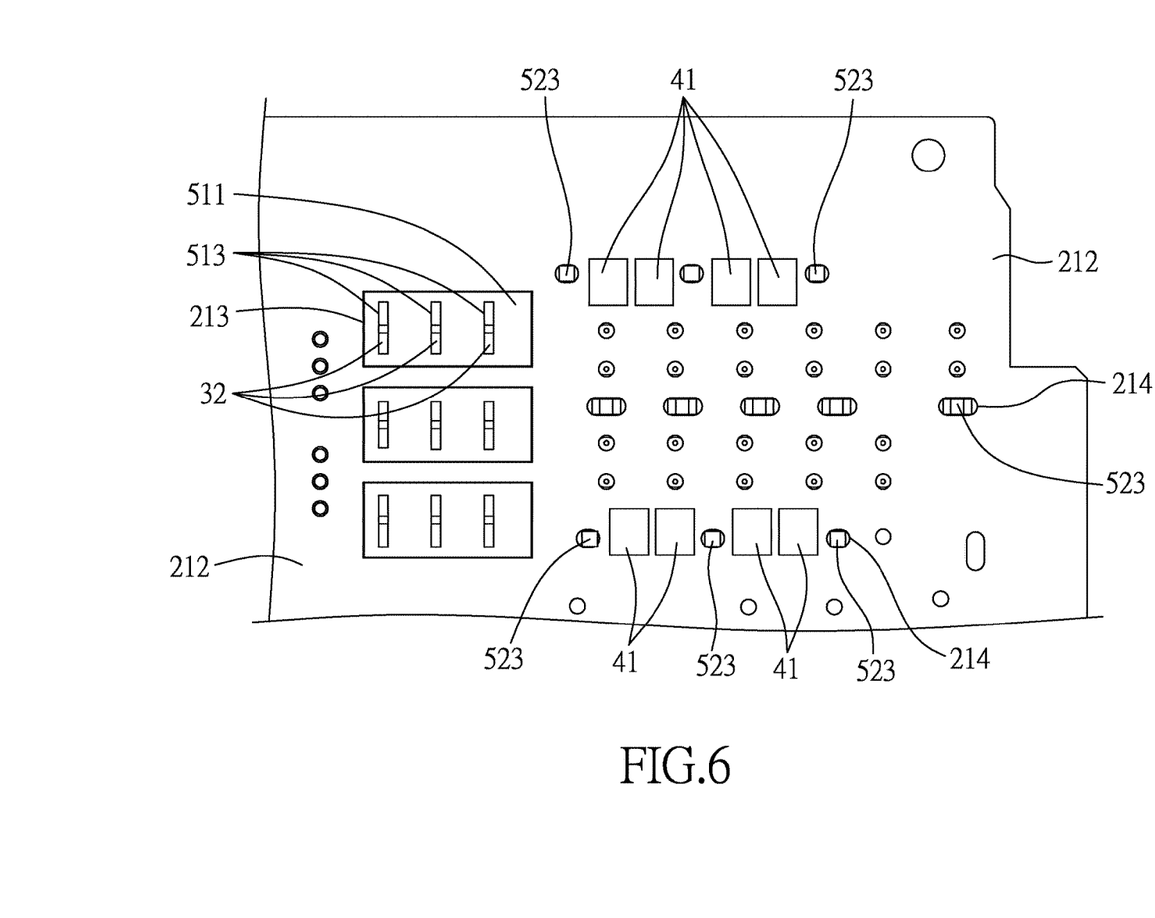
FIG. 6 is a fragmentary schematic bottom view for auxiliary illustration of the variant shown in FIG. 5.

Referring to FIGS. 5 and 6, each of the racks 5 may correspond to a plurality of leads 32'. The number of the inserting portions 513 of the first support portion 51 of each of the racks 5 may be varied according to the number of corresponding ones of the leads 32'. For example, specifically referring to FIG. 5, since each of the racks 5 corresponds to three ones of the leads 32', the first support portion 51 of each of the racks 5 is provided with three corresponding ones of the inserting portions 513. It should be understood that the numbers of the inserting portions 513 of each of the racks 5 and the leads 32' corresponding thereto may be varied according to practical implementation, and are not limited to those illustrated in FIG. 5.

Figure 7:
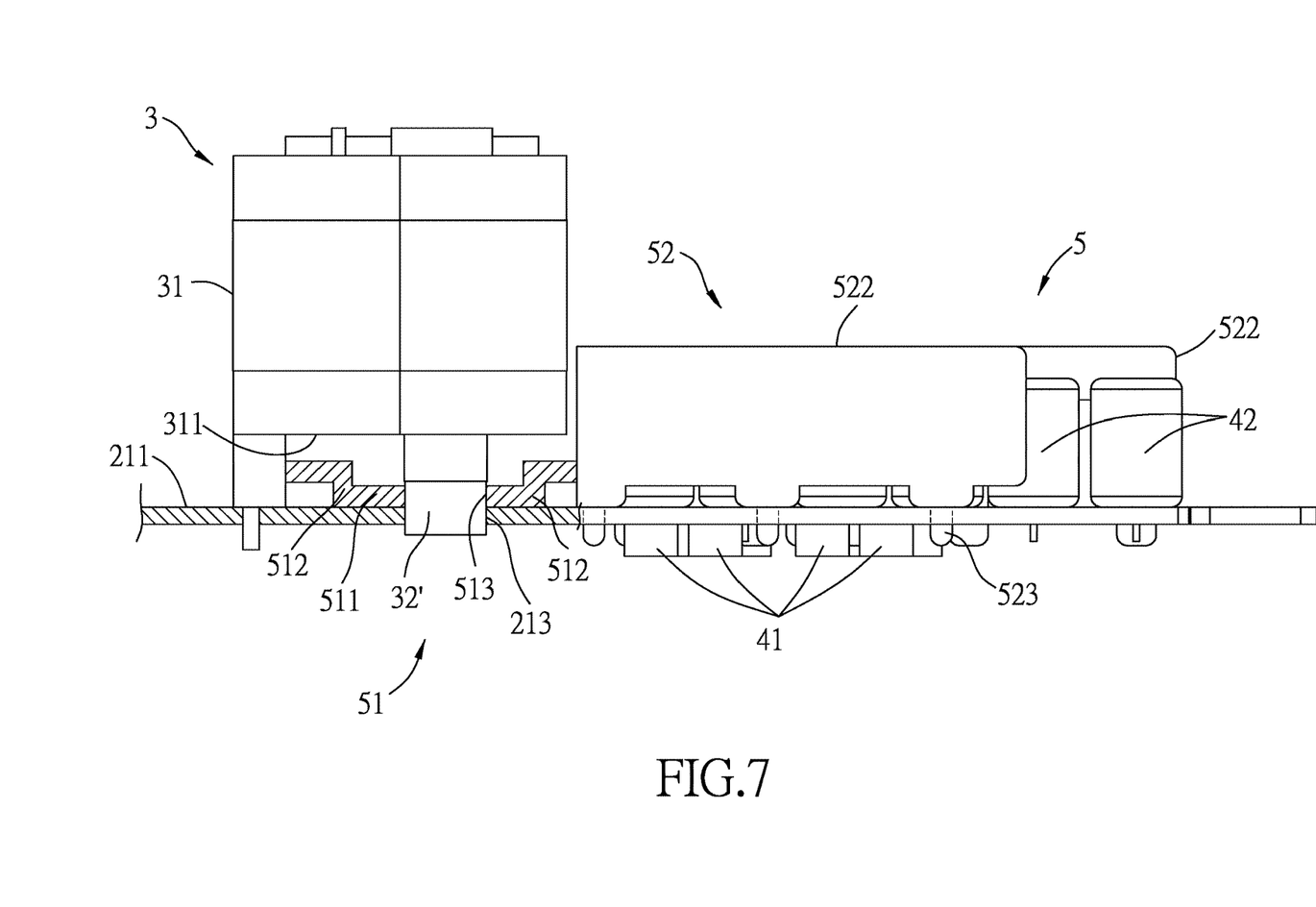
FIG. 7 is a schematic side view to illustrate another configuration for a connection between racks and a substrate.

Referring to FIG. 7, the base frame 511 of each of the racks 5 may be disposed on the first surface 211 of the substrate 21, rather than penetrating through a corresponding one of the inserting holes 213. That is, the size of each of the inserting holes 213 is smaller than the size of the cross section of the base frame 511 or corresponds to the size of the cross section of a corresponding one of the leads 32'. The first support portion 51 is installed on a corresponding one of the inserting holes 213, and is fastened onto the first surface 211 of the substrate 21. The leads 32' of the transformer 3 penetrate through the inserting portions 513 correspondingly and are connected to the first support portion 51 of a corresponding one of the racks 5 so as to permit the transformer 3 to be fastened to the substrate 21. The heat produced by the transformer 3 may be dissipated outside via the connection of the leads 32' of the transformer 3 to the racks 5.

Figure 8:
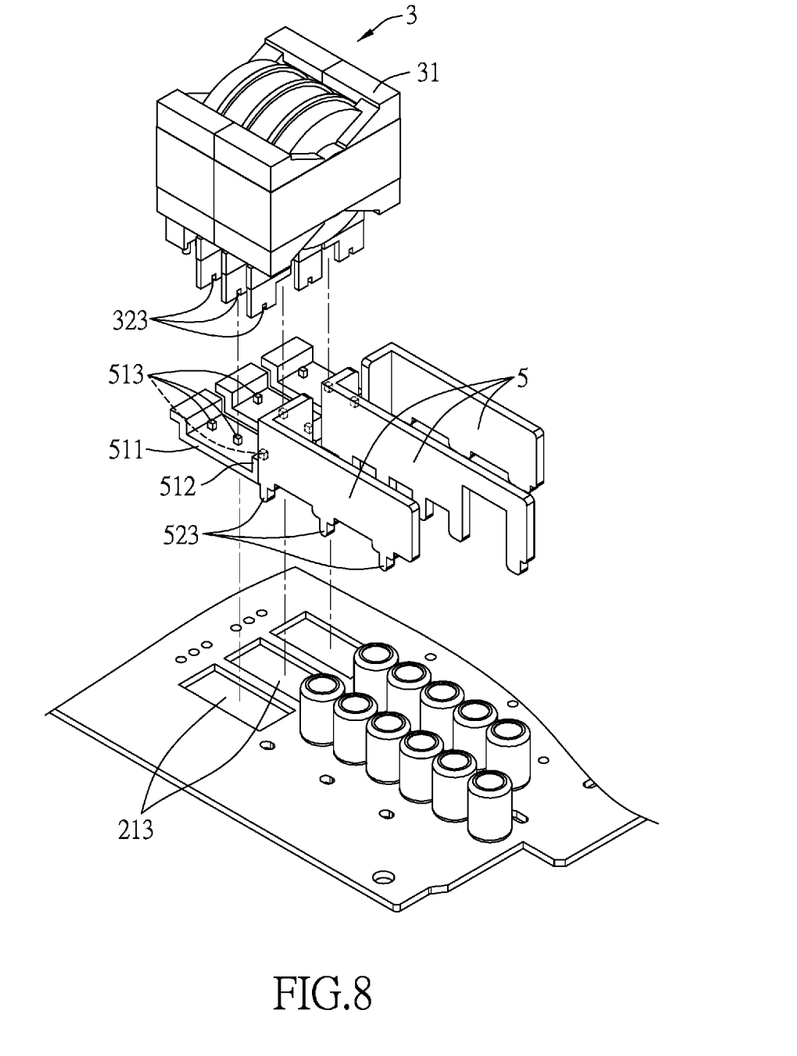
FIG. 8 is a schematic perspective view to illustrate a configuration for engagement of leads to inserting portions.

As illustrated in FIGS. 1-7, the leads 32' are connected to the inserting portions 513 in a manner in which each of the inserting portions 513 is configured as an opening and each of the leads 32' is inserted into a corresponding one of the inserting portions 513 and is then connected to a corresponding one of the racks 5 via soldering. Alternatively, referring to FIG. 8, each of the inserting portions 513 and each of the leads 32' may be configured as a male member and a female member, respectively, and are connected to each other in a manner of fittingly engagement of the male member to the female member. For example, each of the inserting portions 513 is configured as a protrusion and a bottom portion of each of the leads 32' is formed with a recess 323 corresponding to the protrusion. Each of the leads 32' is connected to a corresponding one of the inserting portions 513 via a fittingly engagement of the protrusion in the recess 323.

Figure 9:
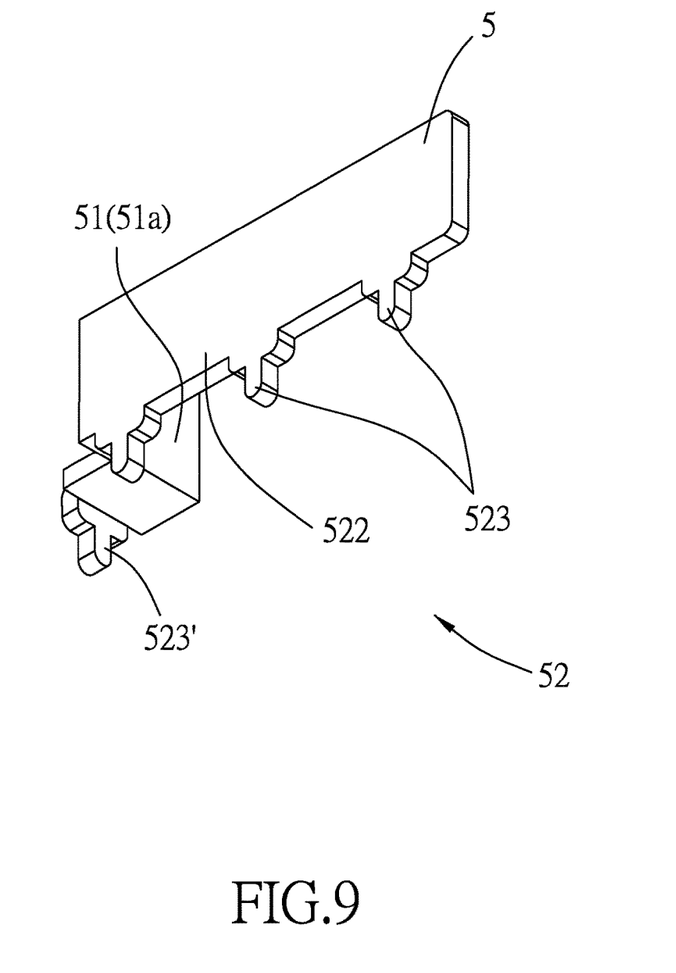
FIG. 9 is a schematic perspective view of another configuration of the rack.

Referring to FIG. 9, in addition to the configuration described above for the first support portion 51 of the rack 5 in which the f first support portion 51 is provided with the base frame 511 and the inserting portion 513 for insertion of a corresponding one of the leads 32' therein, the first support portion 51 may be configured alternatively as a support wall 51a to be installed in a corresponding one of the inserting holes 213. The support wall 51a is fastened and electrically connected to the substrate 21 by penetrating a pin 523' protruded from a bottom portion thereof through a corresponding one of the inserting holes 213 (not shown in FIG. 9) and soldering the pin 523' to the substrate 21. The second support portion 52 extends from a side portion of the support wall 51a and is disposed proximate to the electronic components 4. Therefore, each of the inserting holes 213 is penetrated by corresponding one(s) of the leads 32' of the transformer 3 and the pin 523' of the support wall 51a so that the corresponding one (s) of the leads 32' of the transformer 3 are contiguously connected to the pin 523' of the support wall 51a. The one(s) of the leads 32' of the transformer 3 and the pin 523' of the support wall 51a may be then soldered to the substrate 21 so as to achieve the effects for electrical connection and heat dissipation. The size of each of the inserting holes 213 may be adjusted according to the size(s) of the corresponding one(s) of the leads 32' and the size of the pin 523' of the support wall 51a. It should be understood that the configuration of the support wall 51a is not limited to that illustrated in FIG. 9.

In view of the aforesaid, in the high heat-dissipation circuit board assembly system of the disclosure for an power supply, the racks 5 having large lateral areas may be used for dissipating the heat produced by the transformer 3 and conducting the heat produced by the electronic components 4 installed on the substrate 21. In addition, since the leads 32' and the racks 5 are made from an electrically conductive material, the current from the transformer 3 may be evenly distributed therethrough so that the flow path of the current may be altered and that the copper-clad wiring on the circuit board 2 may be miniaturized. Therefore, the power supply of high voltage may be miniaturized, the cost of the material for the power supply may be reduced, the safety issue may be decreased, and the efficiency of the power supply may be enhanced. In addition, since the first support portion 51 of each of the racks 5 may penetrate through the substrate 21 and protrude from the second surface 212 of the substrate 21, the heat produced by the transistors 41 installed on the second surface 212 of the substrate 21 may be more easily conducted and dissipated. Therefore, the disadvantage of heat accumulation at the second surface encountered in the prior art may be avoided, and the efficiency and the heat conductivity effect of the power supply may be enhanced. It should be noted that the circuit board assembly system of the disclosure may be applied in other electronic devices such as a motherboard for a computer, a circuit board for a server, and the like.

In the description above, for the purposes of explanation, numerous specific details have been set forth in order to provide a thorough understanding of the embodiment(s). It will be apparent, however, to one skilled in the art, that one or more other embodiments may practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connect ion with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A high heat-dissipation circuit board assembly system, comprising:

a circuit board including a substrate having a first surface and a second surface opposite to each other, an electric circuit formed on said substrate, and at least one inserting hole penetrating through said substrate;

a transformer installed on said first surface of said substrate and electrically connected to said electric circuit;

a plurality of electronic components installed on said substrate and electrically connected to said electric circuit; and at least one rack fastened on said first surface of said substrate and including a first support portion and a second support portion extending from said first support portion, said first support portion being installed corresponding to said inserting hole and being connected to said transformer, said second support portion extending from said first support portion toward said electronic components and being installed upright on said substrate;

wherein said transformer includes a main body having a bottom portion, and at least one height-adjusting member disposed on said bottom portion of said main body, at least one gap being formed between said transformer and the substrate using said at least one height-adjusting member;

said at least one height-adjusting member is inserted in said inserting hole corresponding to said at least one rack and is connected to said at least one rack; and said at least one height-adjusting member is a lead for said transformer and is electrically connected to said first support portion correspondingly.

2. The high heat-dissipation circuit board assembly system according to claim 1, wherein said first support portion includes a base frame and at least one extending segment extending a height upward from said base frame, said base frame including at least one inserting portion and penetrating through said at least one inserting hole and protruding from said second surface of said substrate, said at least one height-adjusting member penetrating through said inserting portion and being connected to said rack, said second support portion extending from said extending segment of said first support portion, said at least one inserting portion being configured as an opening, said at least one height-adjusting member penetrating through said opening and said inserting hole and protruding from said second surface of said substrate, said second support portion including a first support wall connected to said first support portion and having a predetermined height, a second support wall extending from a side of said first support wall, and a plurality of pins extending from a bottom portion of said second support wall, said second support wall being installed upright on said first surface of said substrate, said pins penetrating through said substrate and being electrically connected to at least some of said electronic components.

3. The high heat-dissipation circuit board assembly system according to claim 1, wherein said electronic components include two rows of transistors and two rows of capacitors arranged between said two rows of said transistors, said high heat-dissipation circuit board assembly system including three of said rack, two of said rack being installed corresponding to said two rows of said transistors, and the last one of said rack being installed between said two rows of said capacitors.

4. The high heat-dissipation circuit board assembly system according to claim 1, wherein said first support portion includes a base frame and at least one extending segment extending a height upward from said base frame, said at least one height-adjusting member being a lead for said transformer, said base frame being disposed on said first surface of said substrate, a size of said at least one inserting hole being smaller than a size of a cross section of said base frame and corresponding to a size of a cross section of said lead, and said first support portion being installed on said at least one inserting hole and being fastened onto said first surface of said substrate.

5. The high heat-dissipation circuit board assembly system according to claim 1, wherein said first support portion being configured as a support wall to be installed in said at least one inserting hole, said support wall being fastened and electrically connected to said substrate by penetrating a pin protruded from a bottom portion of said support wall through said at least one inserting hole and soldering said pin to said substrate.

6. The high heat-dissipation circuit board assembly system according to claim 1, wherein said at least one height-adjusting member includes a first extending segment extending away from said bottom portion of said main body, and a second extending segment extending from said first extending segment, said first extending segment has a width larger than that of said second extending segment.

7. The high heat-dissipation circuit board assembly system according to claim 1, wherein said rack is made from a metal material.

8. A power supply comprising:
a high heat-dissipation circuit board assembly system including:
a circuit board including a substrate having a first surface and a second surface opposite to each other, an electric circuit formed on said substrate, and at least one inserting hole penetrating through said substrate;
a transformer installed on said first surface of said substrate and electrically connected to said electric circuit;
a plurality of electronic components installed on said substrate and electrically connected to said electric circuit; and
at least one rack fastened on said first surface of said substrate and including a first support portion and a second support portion extending from said first support portion, said first support portion being installed in said inserting hole and being connected to said transformer, said second support portion extending from said first support portion toward said electronic components and being installed upright on said substrate;
wherein said transformer includes a main body, and at least one height-adjusting member disposed on said main body, at least one gap being formed between said transformer and the substrate using said at least one height-adjusting member; and
wherein said at least one height-adjusting member is inserted in said inserting hole corresponding to said at least one rack and is connected to said at least one rack.

9. The power supply according to claim 8, wherein said first support portion includes at least one inserting portion configured to define an opening.

10. The power supply according to claim 8, wherein said at least one height-adjusting member is a lead for said transformer and is electrically connected to said first support portion correspondingly.

11. The power supply according to claim 8, wherein said first support portion includes a base frame and at least one extending segment extending a height upward from said base frame, said base frame including at least one inserting portion and penetrating through said at least one inserting hole and protruding from said second surface of said substrate, said at least one height-adjusting member penetrating through said inserting portion and being connected to said rack, said second support portion extending from said extending segment of said first support portion, said at least one inserting portion being configured to define an opening, said at least one height-adjusting member penetrating through said opening and said inserting hole and protruding from said second surface of said substrate, said second support portion including a first support wall connected to said first support portion and having a predetermined height, a second support wall extending from a side of said first support wall, and a plurality of pins extending from a bottom portion of said second support wall, said second support wall being installed upright on said first surface of said substrate, said pins penetrating through said substrate and being electrically connected to at least some of said electronic components.

12. The power supply according to claim 8, wherein said electronic components include two rows of transistors and two rows of capacitors arranged between said two rows of said transistors, said high heat-dissipation circuit board assembly system including three of said racks, two of said racks being installed corresponding to said two rows of said transistors, and the last one of said racks being installed between said two rows of said capacitors.

13. The power supply according to claim 8, wherein said first support portion includes a base frame and at least one extending segment extending a height upward from said base frame, said at least one height-adjusting member being a lead for said transformer, said base frame being disposed on said first surface of said substrate, a size of said at least one inserting hole being smaller than a size of a cross section of said base frame and corresponding to a size of a cross section of said lead, and said first support portion being installed on said at least one inserting hole and being fastened onto said first surface of said substrate.

14. The power supply according to claim 8, wherein said at least one height-adjusting member includes a first extending segment extending away from said bottom portion of said main body, and a second extending segment extending from the first segment, said first extending segment having a width larger than that of said second extending segment.

15. The power supply according to claim 8, wherein said rack is made from a metal material.

16. A power supply, comprising:
  a high heat-dissipation circuit board assembly system including:
    a circuit board including a substrate having a first surface and a second surface opposite to each other, an electric circuit formed on said substrate, and at least one inserting hole penetrating through said substrate;
    a transformer installed on said first surface of said substrate and electrically connected to said electric circuit;
    a plurality of electronic components installed on said substrate and electrically connected to said electric circuit; and
    at least one rack fastened on said first surface of said substrate and including a first support portion and a second support portion extending from said first support portion, said first support portion being installed in said inserting hole and being connected to said transformer, said second support portion extending from said first support portion toward said electronic components and being installed upright on said substrate;
  wherein said first support portion is configured as a support wall to be installed in said at least one inserting hole, said support wall being fastened and electrically connected to said substrate by penetrating a pin protruded from a bottom portion of said support wall through said at least one inserting hole and soldering said pin to said substrate.

17. A high heat-dissipation circuit board assembly system comprising:
  a circuit board including a substrate having a first surface and a second surface opposite to each other, an electric circuit formed on said substrate, and at least one inserting hole penetrating through said substrate;
  a transformer installed on said first surface of said substrate and electrically connected to said electric circuit;
  a plurality of electronic components installed on said substrate and electrically connected to said electric circuit; and
  at least one rack fastened on said first surface of said substrate and including a first support portion and a second support portion extending from said first support portion, said first support portion being installed in said inserting hole and being connected to said transformer, said second support portion extending from said first support portion toward said electronic components and being installed upright on said substrate;
  wherein said transformer includes a main body, and at least one height-adjusting member disposed on said main body, at least one gap being formed between said transformer and the substrate using said at least one height-adjusting member; and
  wherein said at least one height-adjusting member is inserted in said inserting hole corresponding to said at least one rack and is connected to said at least one rack.

18. The high heat-dissipation circuit board assembly system according to claim 17, wherein said first support portion includes at least one inserting portion configured to define an opening.

* * * * *